United States Patent [19]
Yoshida et al.

[11] Patent Number: 5,211,795
[45] Date of Patent: May 18, 1993

[54] PLASMA ETCHING APPARATUS AND TRANSPORTING DEVICE USED IN THE SAME

[75] Inventors: Yukimasa Yoshida; Satoshi Kaneko, both of Yokohama, Japan

[73] Assignee: Tokyo Electron Limited, Tokyo, Japan

[21] Appl. No.: 800,246

[22] Filed: Nov. 29, 1991

[30] Foreign Application Priority Data

Nov. 29, 1990 [JP] Japan .................................. 2-334211

[51] Int. Cl.$^5$ ...................... H01L 21/306; B44C 1/22
[52] U.S. Cl. .................................... 156/345; 156/643; 204/298.35
[58] Field of Search .................... 156/345, 643; 204/192.32, 298.35; 414/744.1, 744.2, 744.4, 744.5, 751, 753

[56] References Cited

U.S. PATENT DOCUMENTS

4,891,087  1/1990  Davis et al. .................... 156/345

FOREIGN PATENT DOCUMENTS

183736  9/1985  Japan .
87351  5/1986  Japan .

*Primary Examiner*—William A. Powell
*Attorney, Agent, or Firm*—Oblon, Spivak, McClelland, Maier & Neustadt

[57] ABSTRACT

A transporting device used in a plasma etching apparatus comprises a loading unit having a loading surface on which articles to be treated are loaded, and a moving mechanism for moving the loading unit. The loading unit is coated with an electrically conducting layer for moving electric charges accumulated on the loading surface due to plasma etching and preventing erosion of the loading unit.

14 Claims, 9 Drawing Sheets

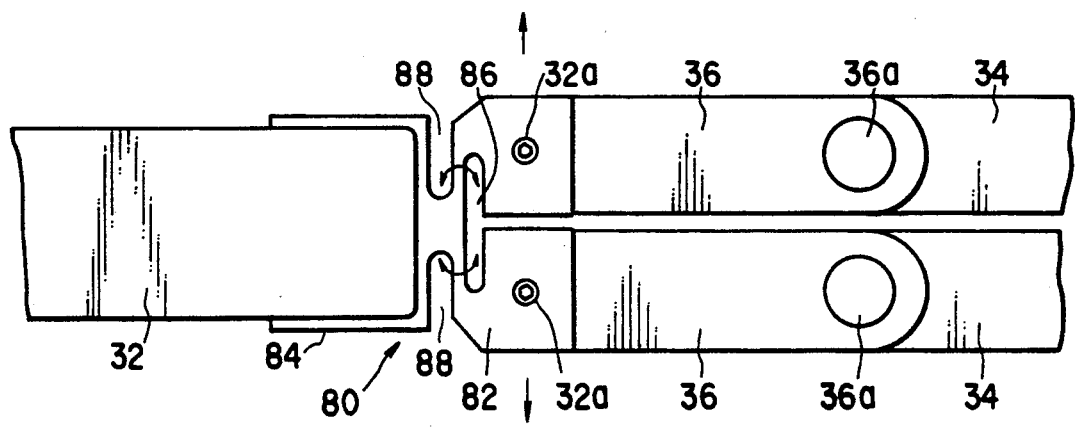
F I G. 7
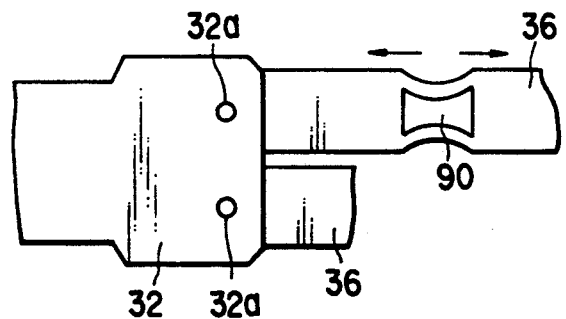
F I G. 10

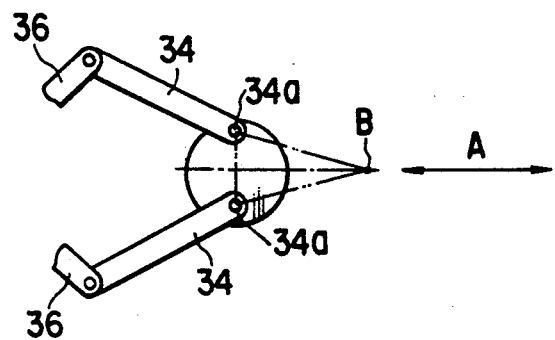
F I G. 13
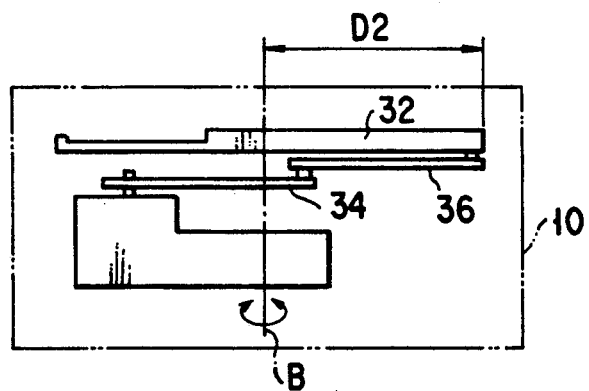
F I G. 14

PLASMA ETCHING APPARATUS AND TRANSPORTING DEVICE USED IN THE SAME

BACKGROUND OF THE INVENTION

1. Field of the Invention

This invention relates to a plasma etching apparatus employed in the manufacturing process of semiconductor elements and a transporting device used in the same.

2. Description of the Related Art

Semiconductor element manufacturing devices frequently employ transporting devices of frog leg type for transporting semiconductor wafers. The transporting devices of frog leg type are disclosed in Japanese Laid-open Patent Application Publication 60-183736 (PCT/US84/00185) and Japanese Laid-open Patent Application Publication 61-87351.

Recently, as electronic elements have been highly integrated and densified, it has become required that the amount of dust be reduced more and more in the atmosphere of the treatment chamber. In a plasma etching apparatus, for example, the transporting device is provided in a load-lock chamber whose interior can be vacuumed. Wafers are received by a sender unit under the normal atmospheric pressure, transported into the load-lock chamber, disconnected from the outer atmosphere in the load-lock chamber, and then moved into a process chamber.

However, this arrangement is still encountered with the problem that dust is brought into the process chamber, reducing the yield. The inventors of this invention found that this problem occurs from the fact that dust is particularly likely to be attached to a loading surface on which article to be treated are loaded.

SUMMARY OF THE INVENTION

The object of this invention is to provide a plasma etching apparatus and a transporting device in which the amount of dust attached to the loading surface on which articles to be treated are loaded can be reduced.

The object of this invention is achieved by a transporting device used in a plasma etching apparatus, which comprises a loading unit having a load surface on which articles to be treated are loaded, moving means for moving the loading unit and means for removing electric charges accumulated on the load surface and preventing the loading unit from being eroded.

The object of this invention is also attained by a plasma etching apparatus which comprises housing means for containing articles to be treated, moving means for moving the loading unit, a process chamber for plasma-etching the articles to be treated and transporting means for transporting the articles to be treated from the housing means into the process chamber. The moving means comprises a loading unit having a loading surface on which the articles to be treated are loaded. The loading surface is coated with an electrically conducting layer electrically connected to the ground.

As aforementioned, the attachment of dust to the loading surface on which articles to be treated occurs due to the fact that static electricity produced by electric charges accumulated on the loading surface attracts the dust. Electric charges are remarkably generated in a plasma treating apparatus. It was found that this phenomenon appears particularly in a magnetron etcher for converging plasma.

In this invention, the loading unit is coated with an electrically conducting layer electrically connected to the ground to remove accumulated electrical charges and prevent dust attachment.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a partial view of a modification of the mechanism for changing the distance between the pivots of the transporting arm;

FIG. 10 is a partial view of a mechanism for changing the arm length of a transporting arm;

FIGS. 13 and 14 are a plan view and a side view of another embodiment of the mechanism for rotating the transporting arm, respectively.

DETAILED DESCRIPTION OF THE PREFERRED EMBODIMENTS

This invention will be described by way of the preferred embodiments and modifications with reference to the accompanying drawings.

Figure 1:
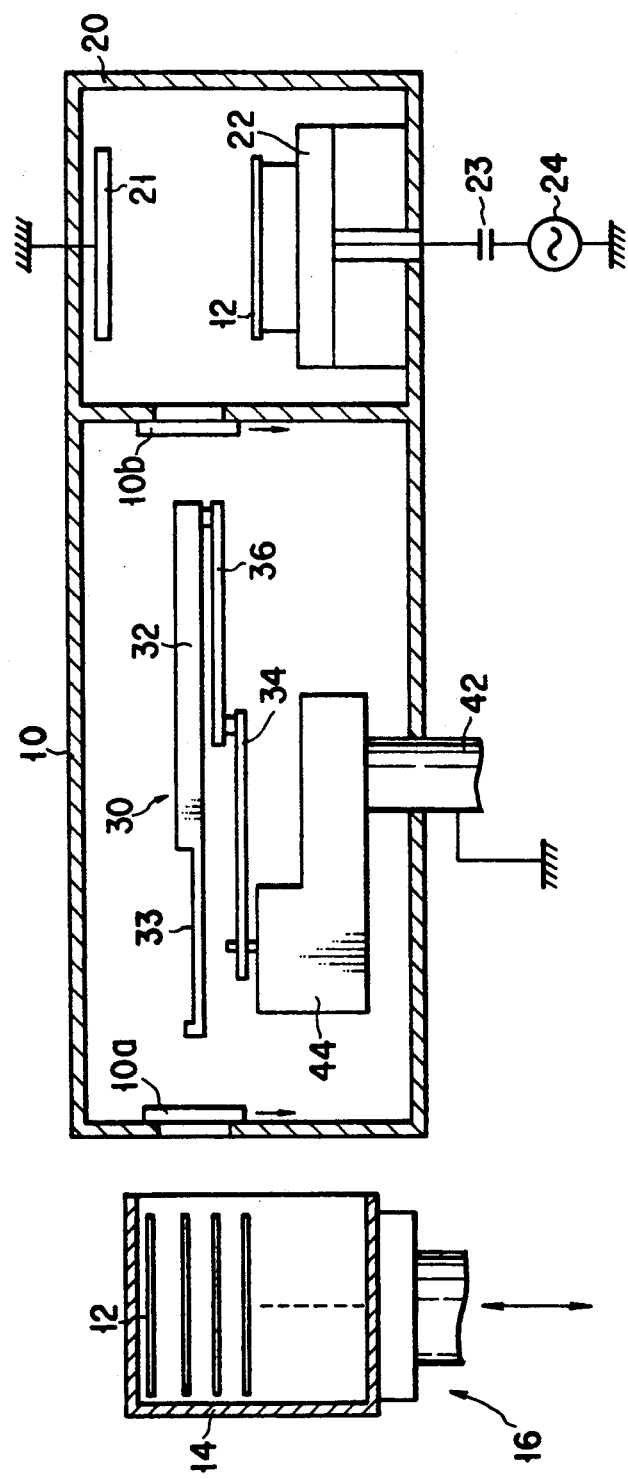
FIG. 1 is a general view of an embodiment of the plasma etching apparatus according to this invention.

FIG. 1 shows an embodiment of the plasma etching apparatus according to this invention which comprises a load-lock chamber 10 and a process chamber 20 and a transporting device 30 provided in the load-lock chamber, for transporting semiconductor wafers 12 as articles to be treated. A vacuum pump (not shown) is connected to the load-lock chamber 10 and the process chamber 20 so as to vacuum the interior of the chambers 10 and 20.

Openable gates 10a and 10b are provided on both sides of the load-lock chamber 10. At the left side of the gate 10a is placed a sender unit 16 on which is mounted a wafer cassette 14 containing a plurality of (25, for example) semiconductor wafers 12. The wafer cassette 14 is moved vertically by means of the sender unit 16 and the top arm 32 is designed to retreat as described later. In this arrangement, the wafers 12 are transported one by one from the interior of the wafer cassette 14 into the process chamber 20.

The sender unit 16 is under the normal atmospheric pressure. At the right side of the load-lock chamber 10 is disposed the process chamber 20 and communicates with the same via the openable gate 10b.

An upper electrode 21 and a lower electrode 22 are provided in the process chamber 20. The upper electrode 21 is directly electrically connected to the ground and the lower electrode 22 is electrically connected to the ground through a condenser 23 and a high frequency electric power source 24. A device for supplying etching gas (not shown) is connected to the process chamber 20. The wafers 12 are taken out from the wafer cassette 14 by means of the top arm 32, transported into the process chamber 20 and loaded on the lower electrode 22. As the pressure of the processes chamber 20 is reduced and a high frequency voltage is applied between the upper and lower electrodes 21 and 22 as well, plasma is generated so as to etch the surface of the each semiconductor wafer 12.

Figure 2:
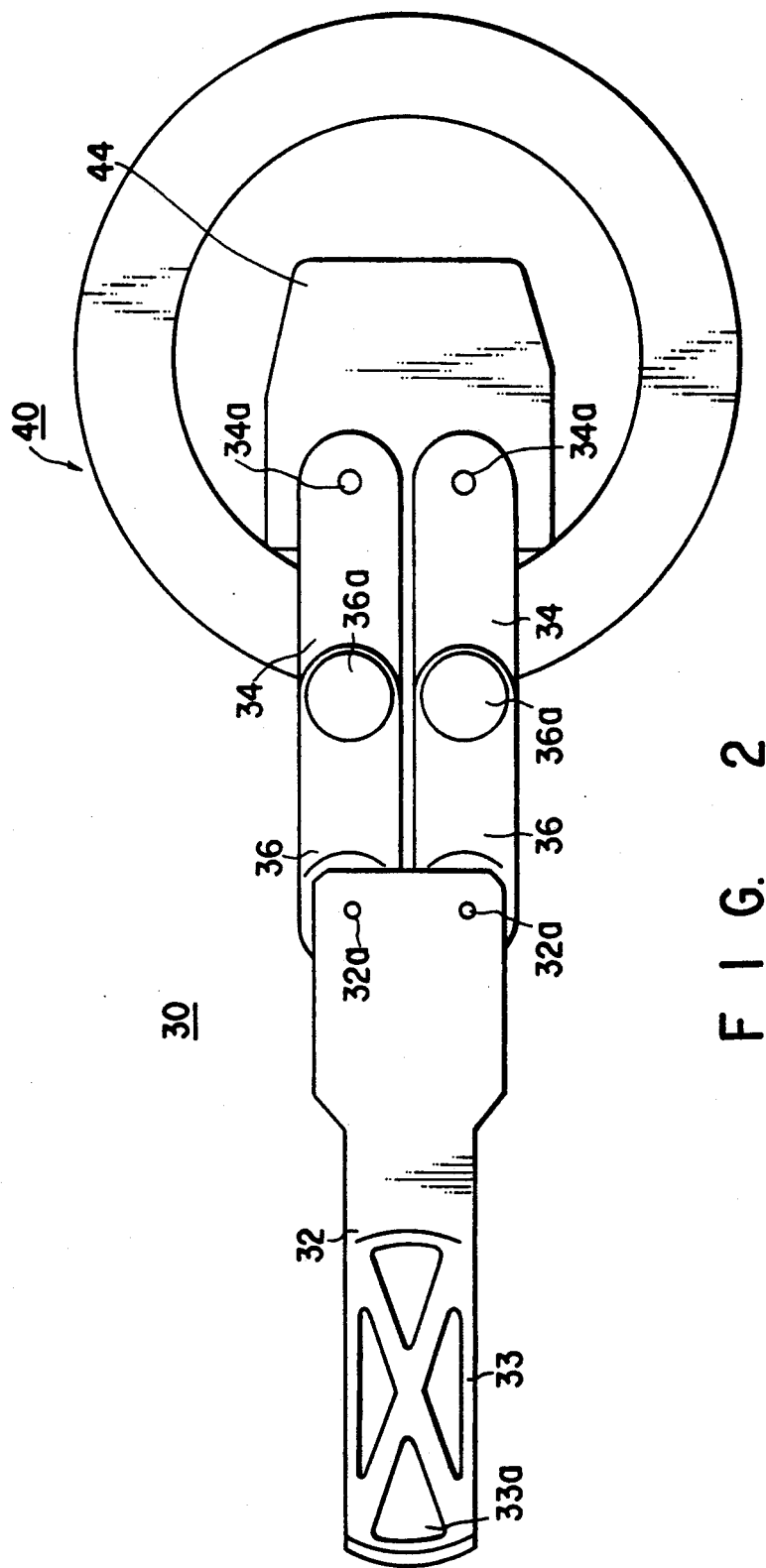
FIGS. 2 and 3 are a plan view and a side view of the transporting arm of the embodiment of FIG. 1, respectively.
Figure 3:
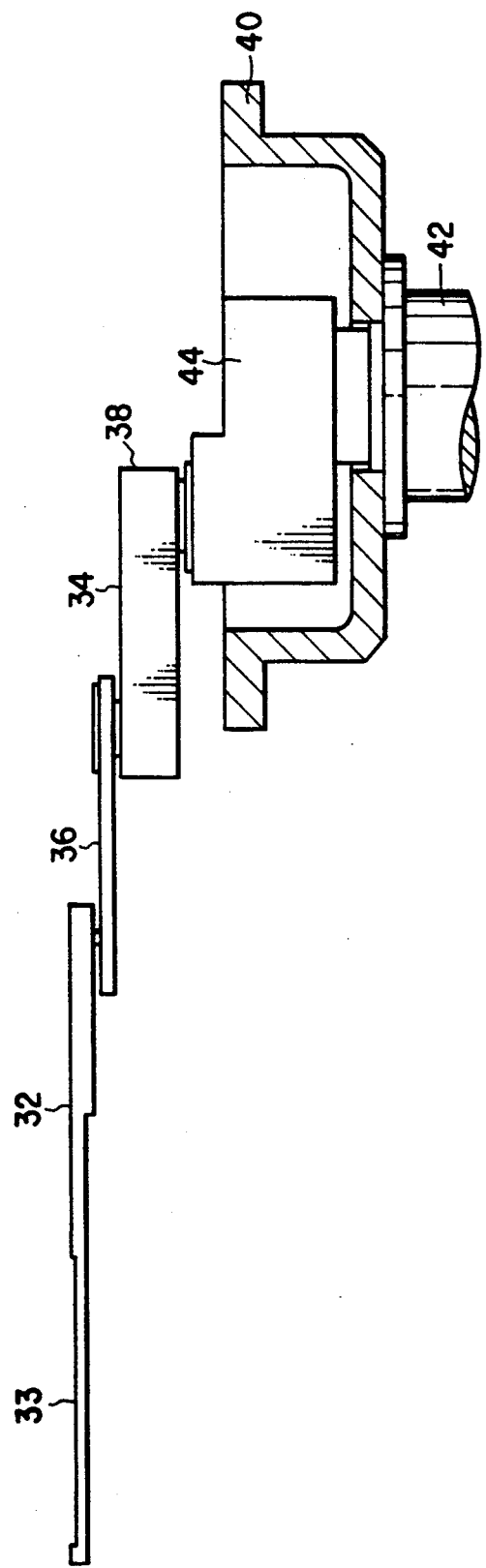

An embodiment of the transporting device will now be described with reference to FIGS. 2 and 3.

In this embodiment, the transporting device 30 employs a transporting arm of frog leg type. A loading surface 33 is formed on the free end portion of the flat plate-like top arm 32, and the formed concave in conformity with the shape of a wafer. Four holes 33a are formed in the surface 33 to preserve its strength and render its weight light.

Generally, the top arm 32 is made of aluminum and its surface is oxidized to be protected from erosion and enhance anti-wearing property.

For improving the electrical conductivity of the loading surface 33, the surface of the top arm 32 is coated with an electrically conducting layer having resistivity of $10^4$ $\Omega$cm or less or preferably several $\Omega$cm or less. The layer may be made of titan nitride (TiN).

In order to move the top arm 32, it is provided at its fixed end portion (proximal end portion) with a pair of first arms 34 rotated around corresponding first pivots 34a. A pair of second arms 36 connect the first arms 34 to the top arm 32. Each second arm 36 is rotated around a second pivot 36a provided in the respective first arm 34. The top arm 32 is rotatably supported on the second arms by means of third pivots 32a.

The operation of the principle of the transporting arm is disclosed in the documents mentioned above and well known, the detailed description thereof being omitted. It will now be explained how the driving force are transmitted through the first pivots 34a and the second pivot 36a. To a base 40 for driving the arm is connected a drive source 42 from which the driving force is transmitted to a drive transmitting unit 44 including a belt transmitted mechanism, a gear driving mechanism or the like. In an arm cover 38 covering the first arms 34 is housed mechanism for rotating the first pivots 34a themselves in accordance with the driving force of the drive transmitting unit 44 and a driving mechanism for transmitting the rotational force to the second pivots 36a. Both mechanism are connected to each other by means of a belt, for example.

In this embodiment, the loading surface 33, or the loading surface 33 and some elements of the top arm 32 are grounded, i.e., electrically connected to the ground. Since the top arm 32 is moved linearly by the driving force, the wiring of a cable is complicated and is not preferable when the top arm 32 is connected to the cable. In this embodiment, the loading surface 33 is electrically connected to the mother material of the top arm 32. The second arms 36, the first arms 34, the drive transmitting unit 44 and the drive source 42 are made of electrically conducting material. The metallic chassis of the drive source 42 is electrically connected to the elements 32, 34, 36 and 44 through metallic parts disposed therebetween (such as bearings and gears) and also electrically connected to the ground. In this way, the top arm 32 is grounded through these elements and parts constituting electrically conducting routes.

Conventionally, the aluminum surface of each element constituting the fixing portion is oxidized to increase anti-wear property. In this embodiment, on the other hand, the oxidized films are removed from the surfaces of the contacting elements and the mother material of them are made directly contact each other so as to elevate electrically conductivity.

The operation of the transporting device according to this embodiment will now be described.

As shown in FIG. 1, the transporting device 30 receives a wafer 12 form the sender unit 16 such that the top arm 32 is extended outward from the load-lock chamber 10 after the gate 10a has been opened to dispose the loading surface 33 under a wafer 12 to be taken out, and the cassette 14 is lowered to put the wafer 12 on the loading surface 33.

Next, the top arm 32 retreats and the wafer 12 is housed in the load-lock chamber 10, the interior of the load-lock chamber 10 is disconnected from the outer atmosphere and is vacuumed with the gates 10a and 10b closed.

The gate 10b is opened and the top arm 32 is driven to dispose the loading surface 33 at the required position in the process chamber 20 such that the wafer 12 is received by the lower electrode (treating loading base) 22. Thereafter, the top arm 32 is held at the waiting position in the load-lock chamber 10 with the gate 10b closed until the etching is completed.

Since the top arm 32 is moved under both the normal atmospheric pressure and a vacuum in the process chamber 20, how dust from the outer atmosphere is prevented from being attached to the loading surface 33 on which the wafers 12 are loaded greatly affects the treating yield. Thus, it is necessary to prevent static electricity which causes electrostatic dust absorption.

In this embodiment, the loading surface 33 is coated with a titan nitrite (TiN) layer and the layer is grounded via the mother material of the top arm 32, the second arms 36, the first arms 34, the drive transmitting unit 44, the drive source 42 and the metallic parts (such as the bearings and gears) disposed therebetween. Even if, therefore, the loading surface 33 is changed, the electrical charges immediately flows into the ground through the electrical conducting routes, thereby refraining static electricity from being generated on the loading surface 33.

Such means for preventing electrostatic attachment of dust to the loading surface avoids the attachment of dust to the rear faces of wafers 12 and keeps dust from being brought into the process chamber 20. In doing so, the yield for treating wafers can be elevated.

A mechanism for moving the loading surface 33 in FIG. 1 smoothly from the right side to the left side will be now be described with reference to FIGS. 4 and 5.

First, the pivot distance L1 between the first arms 34 is made equal to the pivot distance L2 between the second arms 36, and third pivots 32a which are points connecting the to arm 32 to the second arms 36 have a specific feature as described below.

Two grooves 60 are formed in the rear face of the top arm 32, and two linear slide shafts 62 extend through them and fixed to the to arm 32. Slide members 64 having a slightly smaller width then the grooves 60 are fitted in the grooves 60 and have the respective linear slide shafts 62 inserted therein and supported thereby such that the slide members 64 are movable in the directions indicated by arrows E in FIG. 4. A recessed portion 64a is formed in the outer lateral side of each slide member 64, and a spring 68 is disposed between the received portion 64a and the corresponding outer side wall face of the respective groove 60 such that the slide members 64 are urged to be movable inwardly. To the distal end portion (forward end portion) of each second arm 36 is fixed a pivotal shaft 70 having the upper end rotatably supporting the corresponding slide member 64. In short, the top arm 32 is rotatably supported on the second arms 36 through the slide members 64.

Figure 4:
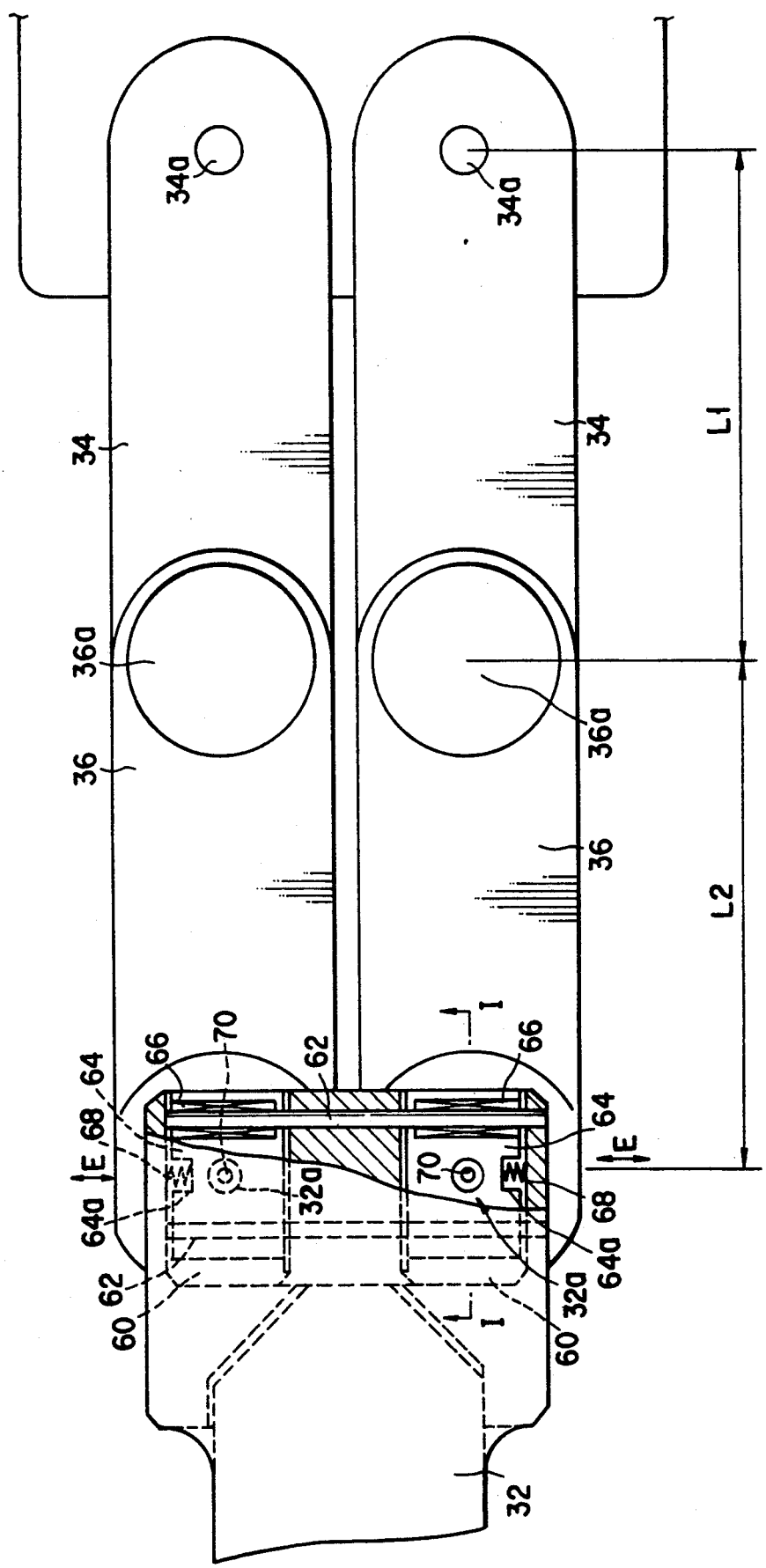
FIG. 4 is a partially cross-sectioned view of the main part of the transporting arm.
Figure 5:
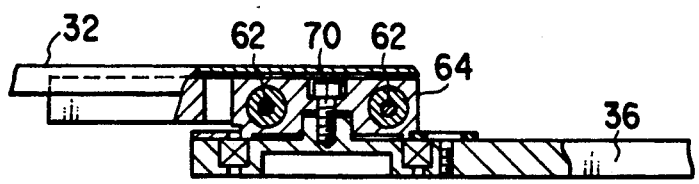
FIG. 5 is a cross-sectional view along line I—I of FIG. 4.
Figure 6:
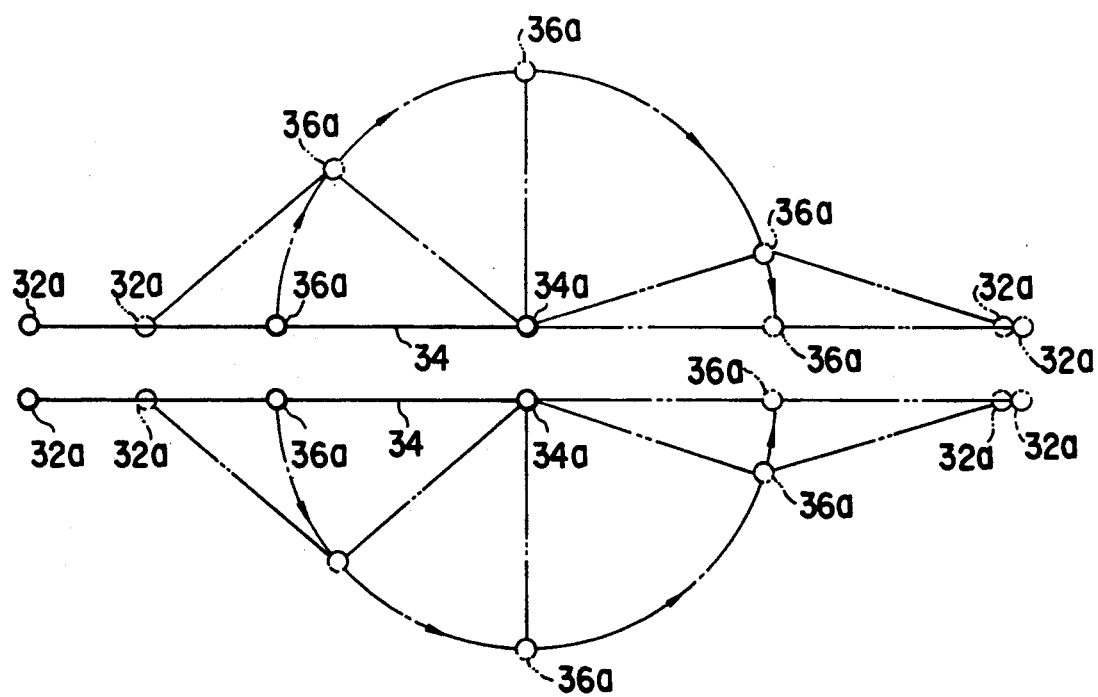
FIG. 6 is a diagram showing loci of the pivots of the transporting arm.

In order to retreat the top arm 32, i.e. to move it from the position shown in FIG. 4 toward the right side, the lower first arm 34 in FIG. 4 is rotated counterclockwise by the drive of the corresponding pivot 34a and, at the same time, the lower second arm 36 is rotated clockwise by the drive of the corresponding second pivot 36a. On the other hand, the upper first and second arms 34 and 36 are rotated reversely. The first arms 34 and the pivots describe locus as shown in FIG. 6. When the first arms 34 are rotated through 90 degrees, the first arms 34 overlap with the corresponding second arms 36. In conventional cases, when the arms overlap with each other and they pass the overlapping positions, loads are applied to the pivots, creating vibrations and malfunction of the apparatus and hindering the smooth transporting operation.

Since the pivotal shafts 70 as driven shafts are movable outward in this embodiment, they absorb the loads and smooth transporting operation is ensured. The slide members 64 can be opened outward against the biasing forces of the compression coil springs 68 having the linear slide shafts 62 in the directions shown by the arrows E. The escarpment of the pivotal shafts 70 at the time of overlapping is ensured, and vibrations and malfunction of the apparatus do not occur. As the top arm 32 is supported by the two compressing coil springs 68 having the same biasing forces, the slide members 64 can be moved back and force on a linear track, irrespective of the movements of the sliding members 64.

The mechanism for changing the distance between the third pivots 32a may be constructed as shown in FIG. 7.

In this modification, flexing portion is provided in a connecting member 80 for connecting top arm 32 to a pair of second arms 36. The connecting member 80 comprises a pivot supporting portion 82 having a pair of third pivots 32a for rotatably supporting the two second arms 36, and an arm fixing portion 84 for fixing the top arm 32. A T-shaped cut-away 86 is formed in the pivot supporting portion 82. Crosswise notched portions 88 are formed in the connecting member 80 between the boundary of the portions 82 and 84 so as to extend inward from the both lateral sides of the connecting member 80. In this arrangement, when the first arms 34 are rotated through 90 degrees and loads are applied thereto, the connecting member 80 which has weak portions such as the cut-away 86 and the notched portions 88 is elastically deformed and the distance between the third pivots 32a are changed.

Figure 8:
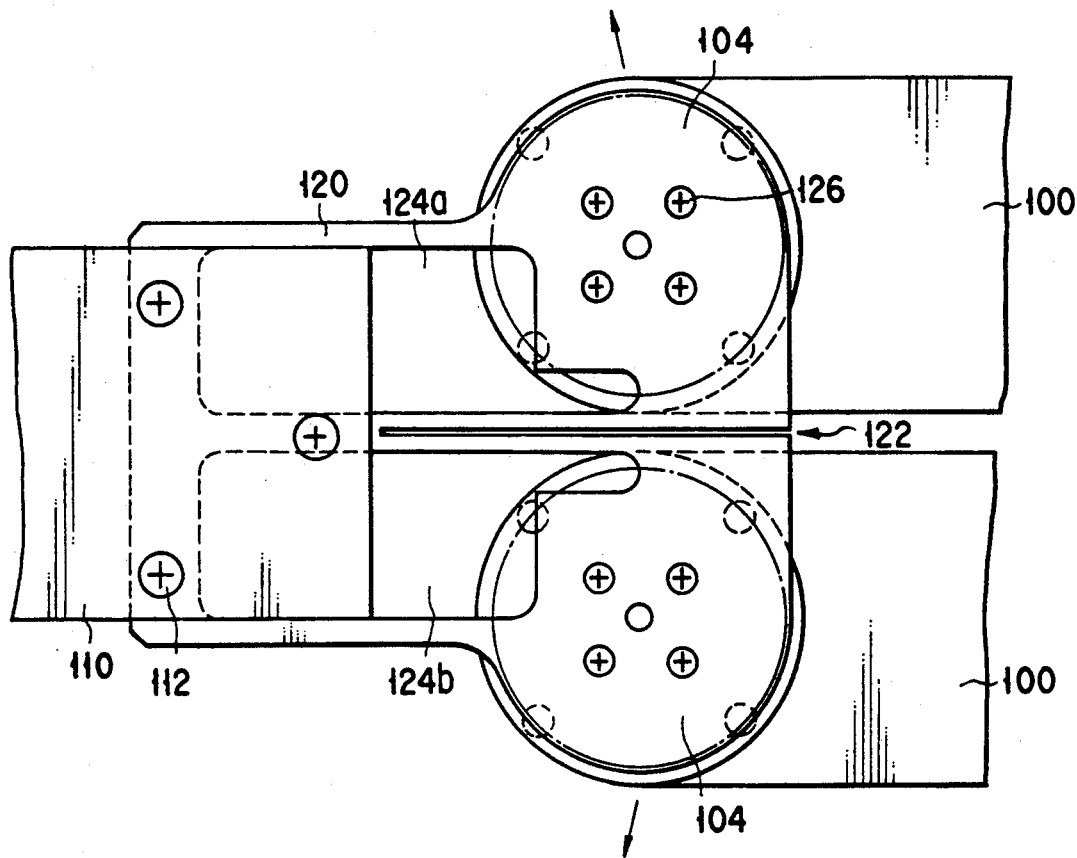
FIGS. 8 and 9 are a plan view and a longitudinal cross-sectional view of another modification of the mechanism for changing the distance between the pivots, respectively.
Figure 9:
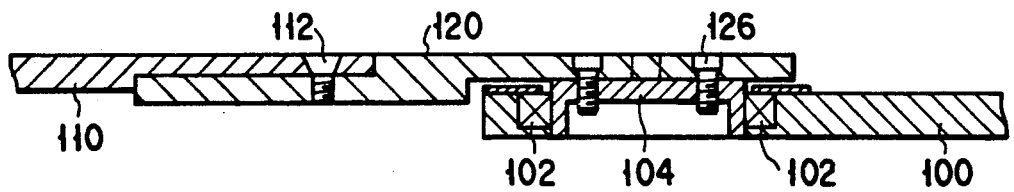

FIGS. 8 and 9 show another modification of the mechanism for elastically changing the distance between the pivots.

As shown in FIG. 9, a pair of second arms 100 are rotatably supported on a top arm 110 through an arm holder 120. Bearings 102 for supporting rotary bodies 104 are provided on the distal end portion (front end portion) of each second arm 100. The rotary bodies 104 are fixed to the arm holder 120 by means of screws 126, and the arm holder 120 is fixed to a top arm 110 by means of a screw 112.

The holder 120 is made form an aluminum plate having a thickness such as 4 to 5 mm. As shown in FIG. 8, a central slit 122 having a predetermined width provided between the rotary bodies 104 in the arm holder 120 so as to extend from the end of the arm holder 120 at the side of the second arms 100 to the central portion of the arm holder 120. Large holes 124a and 124b are formed in the portion of the arm holder 120 on both sides of the central slit 122 so as to extend from the end of the arm holder 120 at the side of the second arms 100 to the central portion of the arm holder 120.

The structure allows the arm holder 120 to be elastically deformed in the directions as shown by the arrows in FIG. 8 such that the distance between the third pivotal shafts can be changed.

The similar operation can be attained by changing the distance between the first pivots 34a. In this case, it is necessary to consider the relation between the first pivots 34a and the shafts which transmit the rotational driving forces to the pivots 34a and the mechanism becomes complicated.

In order to absorb the loads at the time of overlapping, it is not necessary to change the distance between the first pivots 34a or the third pivots 32a but the axial length of the first arms 34 or the second arms 36 may be made variable. For example, as shown in FIG. 10, a flexing portion 90 can be made by cutting off an intermediate portion of each second arm 36.

Figure 11:
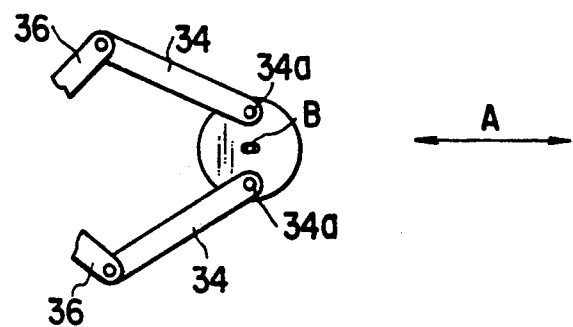
FIGS. 11 and 12 are a plan view and a side view of an embodiment of the mechanism for rotating the transporting arm, respectively.
Figure 12:
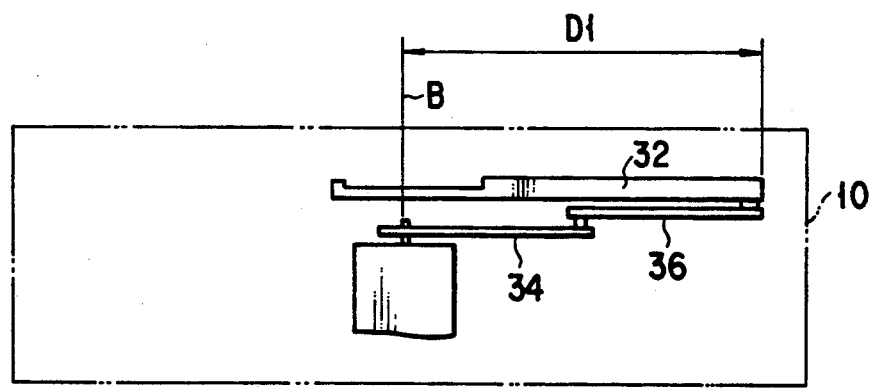

A method for integrally rotating a transporting apparatus 30 will now be described with reference to FIGS. 11 and 12.

In general, the transporting arm of this kind must be constructed so as to be rotated in a direction toward the transporting arm and in a direction toward the process chamber. The center of rotation B is generally located at a point at a line passing the first pivots 34a intersects a line which is along the advancing direction A of the top arm 32 and passes the center between the first pivots 34a, as shown in FIG. 11. As shown in this figure, the radius of rotation $D_1$ must become large as shown in FIG. 12 and the volume of the load-lock chamber 10 must be increased because the rotational drive is performed at the position in which the top arm 32 retreats. In this structure, a large dead space is required in the load-lock chamber 10. In particular, in the load-lock chamber 10, it takes a long time to reduce the pressure from the atmospheric pressure to a required degree of vacuum.

In this respect, it is desirable to adopt the structure as shown in FIGS. 13 and 14. As shown in FIG. 13, the center of rotation B is the apex of an isosceles triangle having the base connecting the first pivots 34a together. The apex is located at the side of the retarding direction of the top arm 32. It is desired that the center of rotation B be provided at the center of the top arm 32. In this case, the radius of rotation $D_2$ is equal to half the length of the load-lock chamber 10 in which the transporting device 30 is housed such that the volume of the load-lock chamber 10 is minimized and can be rendered smaller than the dead space at the time of rotation. This enables the load-lock chamber 10 to be reduced and can shorten the time for reducing the pressure from the normal atmospheric pressure to the required degree of vacuum.

The transporting devices to which this invention is applicable are not limited to the ones of frog leg type but may be transporting devices for transporting articles to be treated by loading them or by sucking and holding them under vacuum.

This invention is not limited to the above-mentioned embodiments and modifications but is applicable to various modifications as long as they are not departed from the spirit of this invention.

What is claimed is:

1. A transporting device used in a plasma etching apparatus, comprising:
    a loading unit having a loading surface on which articles to be treated are loaded;
    means for moving said loading unit; and
    means for removing electric charges accumulated on said loading surface and preventing erosion of the loading unit.

2. The transporting device according to claim 1, wherein said electrical charge removing and erosion preventing means comprises an electrically conducting layer for covering said loading unit, and electrically conducting means for electrically connecting said electrically conducting layer to ground.

3. The transporting device according to claim 1, wherein said loading unit is coated with an electrically conducting layer having a resistivity of $10^4$ $\Omega$cm or less.

4. The transporting device according to claim 1, wherein said loading unit is made of aluminum.

5. The transporting device according to claim 4, wherein said loading unit is coated with a layer of titan nitride.

6. The transporting device according to claim 1, wherein said moving means comprises driving means electrically connected to the ground, and a metallic connecting member for electrically connecting said driving means to said loading unit.

7. The transporting device according to claim 1, wherein said moving means comprises driving means electrically connected to the ground, a pair of first arms having distal end portions and proximal end portions rotatably connected to said driving means, a pair of second arms having distal end portions and proximal end portions rotatably connected to said distal end portions of said first arms, and a top arm connected to said distal end portions of said second arms, said driving means, said first arms, said second arms and said top arm being electrically connected to each other.

8. A plasma etching apparatus comprising:
    (a) housing means for containing articles to be treated;
    (b) a process chamber for plasma-etching said articles to be treated; and
    (c) transporting means for transporting said articles to be treated from said housing means into said process chamber, said transporting means including:
        (i) a loading unit having a loading surface coated with an electrically conducting layer and carrying said articles to be treated, said electrically conducting layer being electrically connected to ground; and
        (ii) moving means for moving said loading unit.

9. The plasma etching apparatus according to claim 8, wherein said transporting means has a transporting arm of frog leg type.

10. The plasma etching apparatus according to claim 8, wherein said loading unit is coated with an electrically conducting layer having a resistivity of $10^4$ $\Omega$cm or less.

11. The plasma etching apparatus according to claim 8, wherein said loading unit is made of aluminum.

12. The plasma etching apparatus according to claim 11, wherein said loading unit is coated with a layer of titan nitride.

13. The plasma etching apparatus according to claim 8, wherein said moving means comprises driving means electrically connected to the ground, and a metallic connecting member for electrically connecting said driving means to said loading unit.

14. The plasma etching apparatus according to claim 8, wherein said moving means comprises driving means electrically connected to the ground, a pair of first arms having distal end portions and proximal end portions rotatably connected to said driving means, a pair of second arms having distal end portions and proximal end portions rotatably connected to said distal end portions of said first arms, and a top arm connected to said distal end portions of said second arms, said driving means, said first arms, said second arms and said top arm being electrically connected to each other.

* * * * *